United States Patent
Mariani et al.

(10) Patent No.: US 8,871,594 B2
(45) Date of Patent: Oct. 28, 2014

(54) PROCESS FOR MANUFACTURING POWER INTEGRATED DEVICES HAVING SURFACE CORRUGATIONS, AND POWER INTEGRATED DEVICE HAVING SURFACE CORRUGATIONS

(75) Inventors: Simone Dario Mariani, Monza (IT); Andrea Paleari, Brugherio (IT); Stephane Wen Yung Bach, Muggio (IT); Paolo Gattari, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 511 days.

(21) Appl. No.: 13/162,951

(22) Filed: Jun. 17, 2011

(65) Prior Publication Data

US 2011/0309480 A1    Dec. 22, 2011

(30) Foreign Application Priority Data

Jun. 17, 2010    (IT) ............... TO2010A0521

(51) Int. Cl.
  *H01L 21/339*    (2006.01)
  *H01L 29/10*    (2006.01)
  *H01L 29/06*    (2006.01)
  *H01L 29/66*    (2006.01)
  *H01L 29/08*    (2006.01)
  *H01L 29/78*    (2006.01)
  *H01L 29/423*    (2006.01)
  *H01L 29/40*    (2006.01)

(52) U.S. Cl.
  CPC ........ *H01L 29/7816* (2013.01); *H01L 29/1037* (2013.01); *H01L 29/42368* (2013.01); *H01L 29/402* (2013.01); *H01L 29/0657* (2013.01); *H01L 29/66681* (2013.01); *H01L 29/0886* (2013.01); *H01L 29/42356* (2013.01); *H01L 29/0869* (2013.01); *H01L 29/0653* (2013.01); *H01L 29/1095* (2013.01)
  USPC ........... 438/279; 438/294; 438/297; 257/335; 257/341; 257/E29.022; 257/E21.24

(58) Field of Classification Search
  IPC .................... H01L 21/76221,29/0657, 29/0869, H01L 29/0886, 29/1095, 29/0852, 29/7816
  See application file for complete search history.

(56) References Cited

U.S. PATENT DOCUMENTS 5,466,624 A * 11/1995 Ong et al. ..................... 438/263
6,677,202 B2    1/2004 Semple et al.
(Continued)

FOREIGN PATENT DOCUMENTS

JP    61091964 A    5/1986

OTHER PUBLICATIONS

Italian Search Report and Written Opinion dated Jan. 20, 2011 from corresponding Italian Application No. TO20100521.

(Continued)

*Primary Examiner* — Eva Y Montalvo
(74) *Attorney, Agent, or Firm* — Gardere Wynne Sewell LLP

(57) ABSTRACT

According to a process for manufacturing an integrated power device, projections and depressions are formed in a semiconductor body that extend in a first direction and are arranged alternated in succession in a second direction, transversely to the first direction. Further provided are a first conduction region and a second conduction region. The first conduction region and the second conduction region define a current flow direction parallel to the first direction, along the projections and the depressions. To form the projections and the depressions, portions of the semiconductor body that extend in the first direction and correspond to the depressions, are selectively oxidized.

15 Claims, 8 Drawing Sheets

(56) References Cited

U.S. PATENT DOCUMENTS

2005/0023569 A1   2/2005   Yang
2010/0001345 A1   1/2010   Furuhata et al.
2010/0270614 A1   10/2010  Croce et al.

OTHER PUBLICATIONS

Zhu Y, et al., *Folded Gate LDMOS Transistor With Low On-Resistance and High Transconductance,* IEEE Transactions on electron Devices, IEEE Serice Center, Pisacataway, NJ, US, vol. 48, No. 12, Dec. 1, 2001, XP011017917.

* cited by examiner

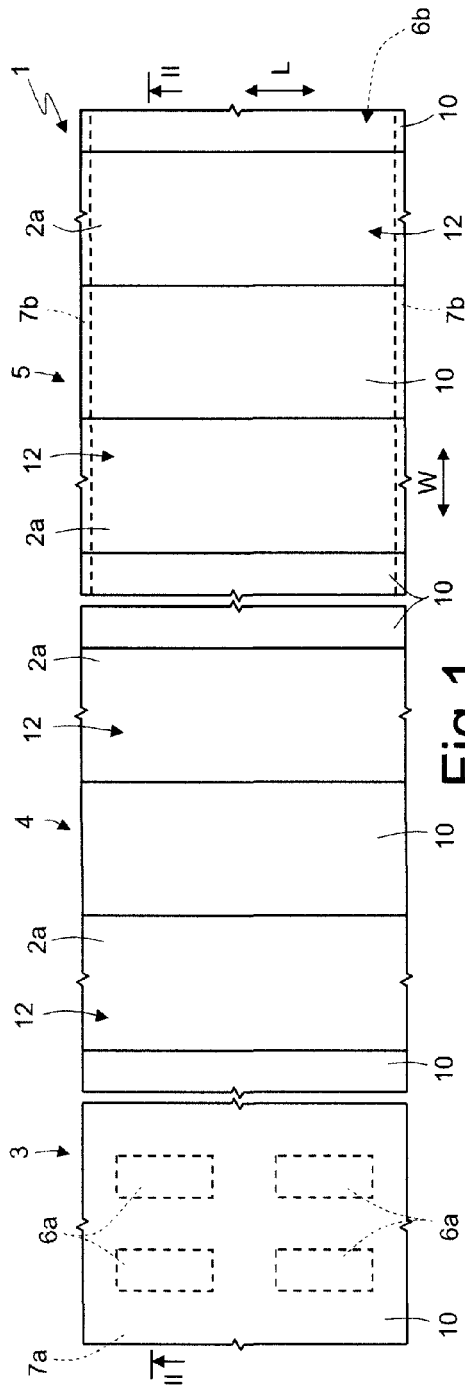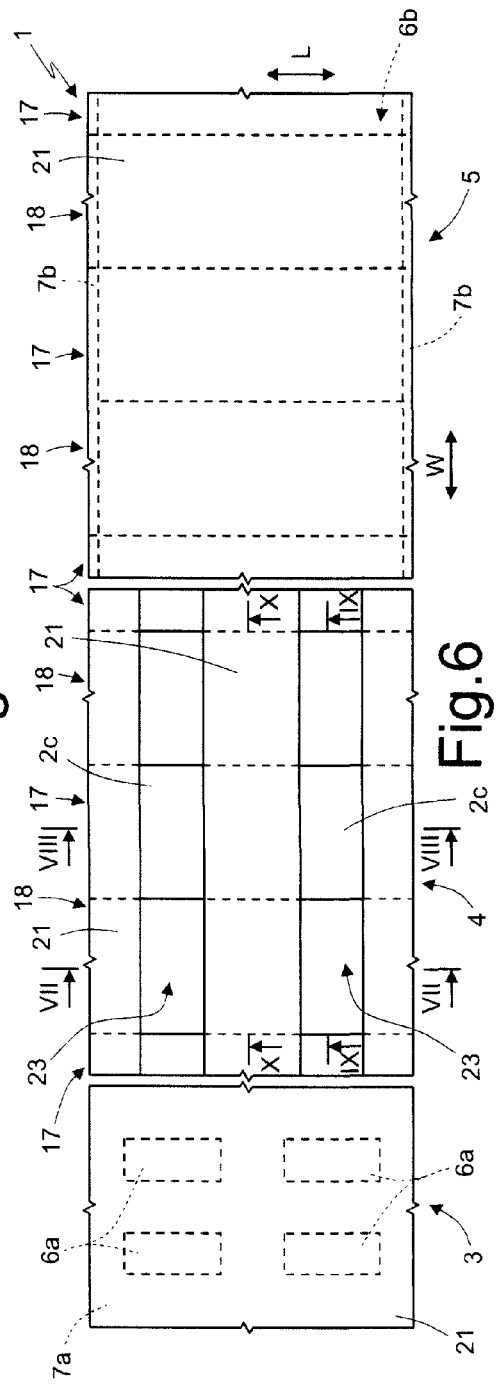

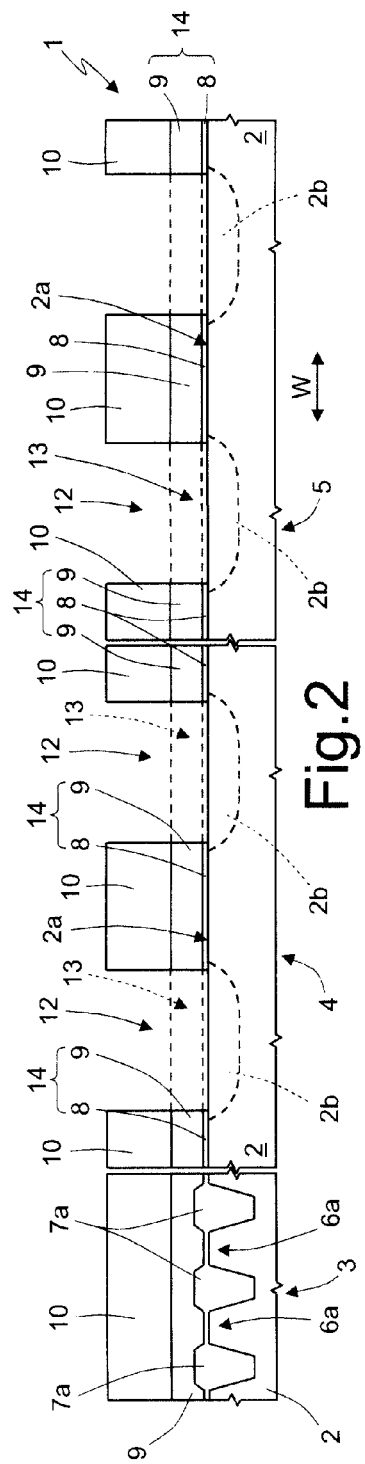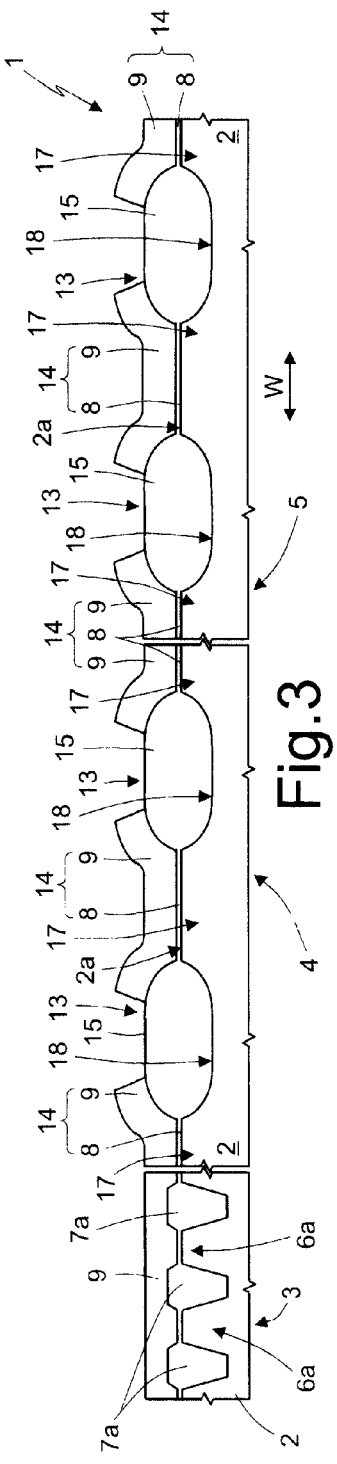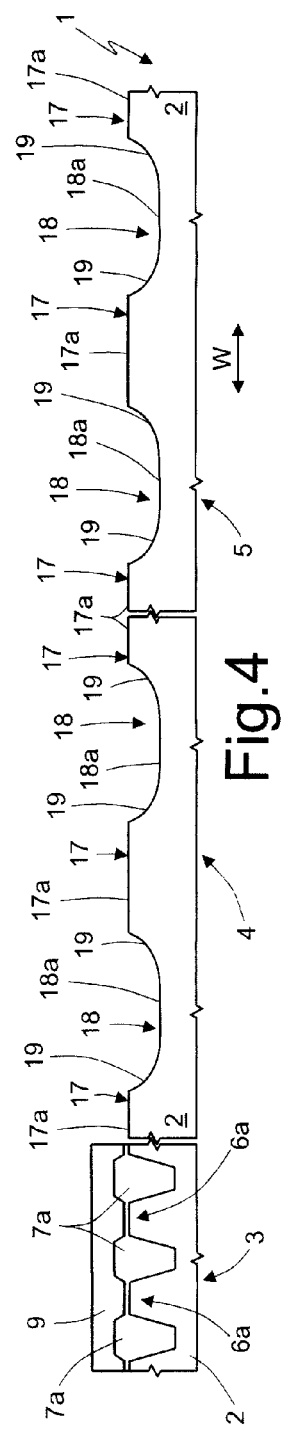

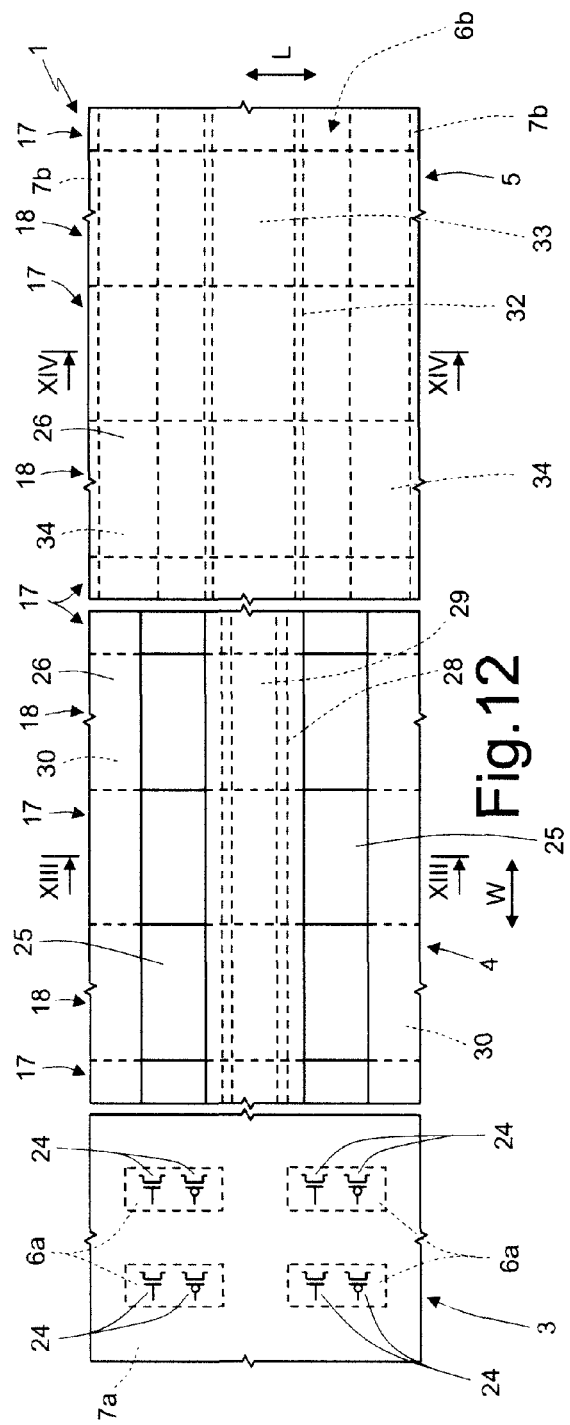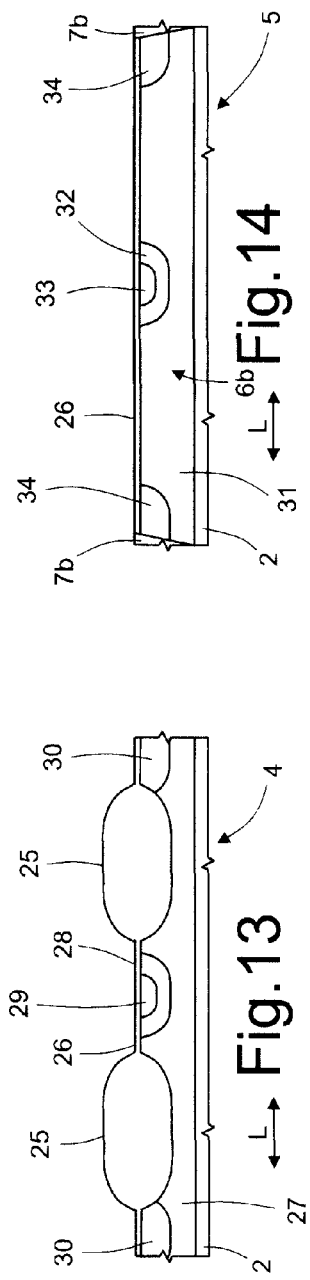

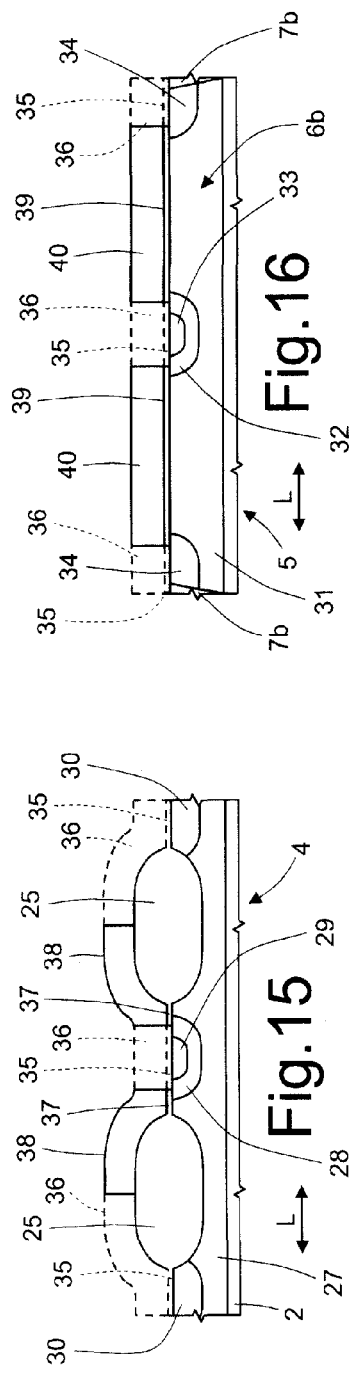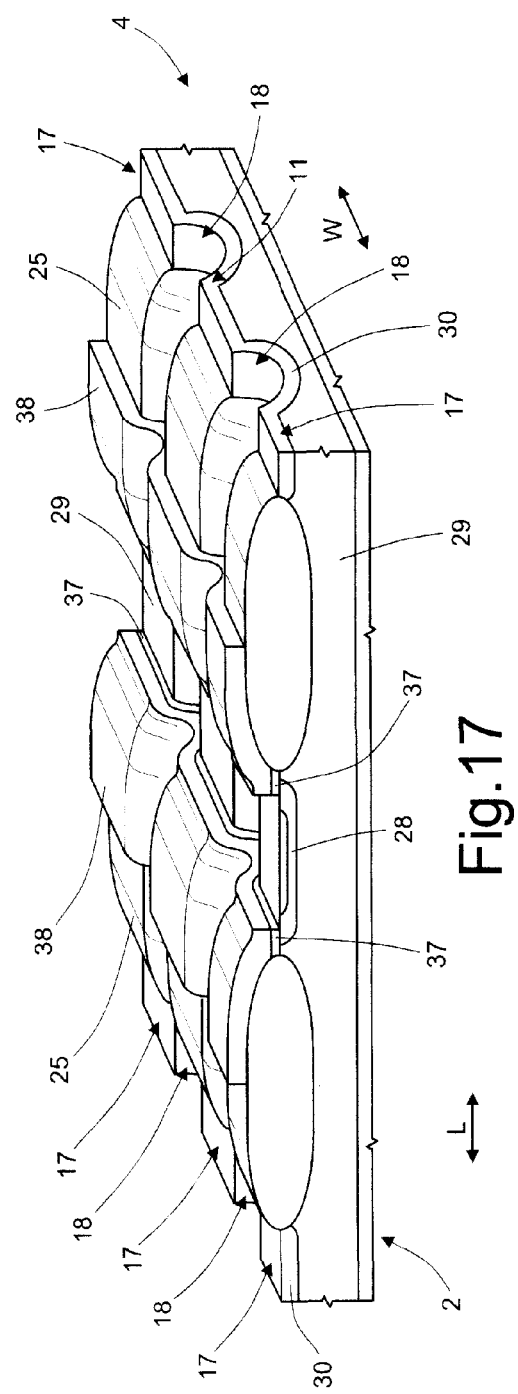

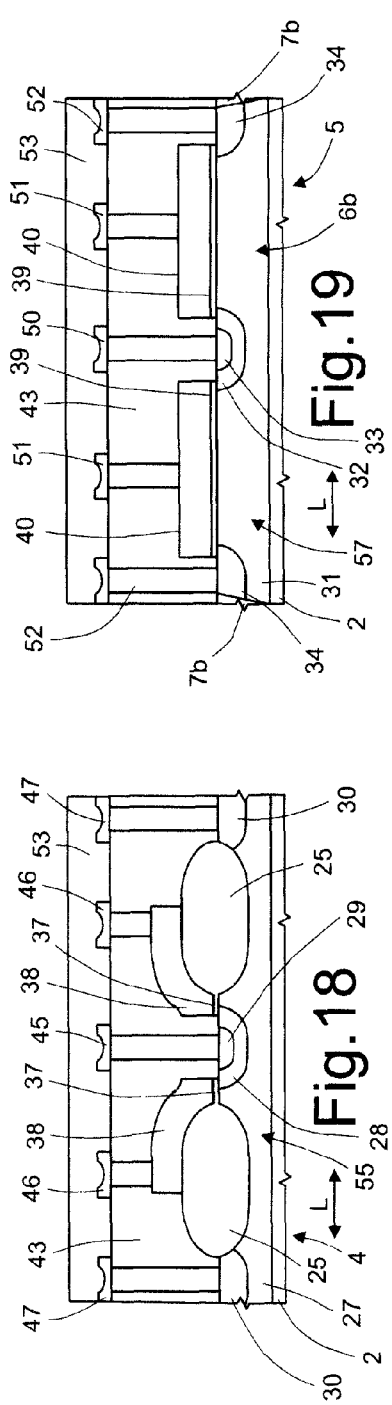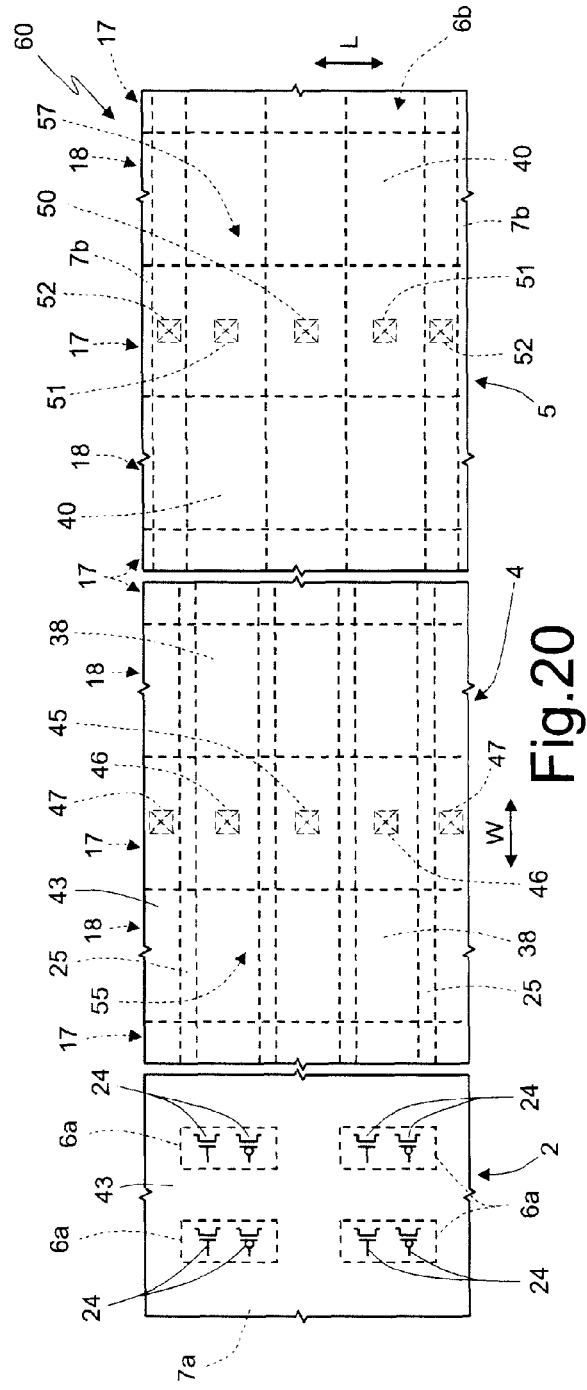

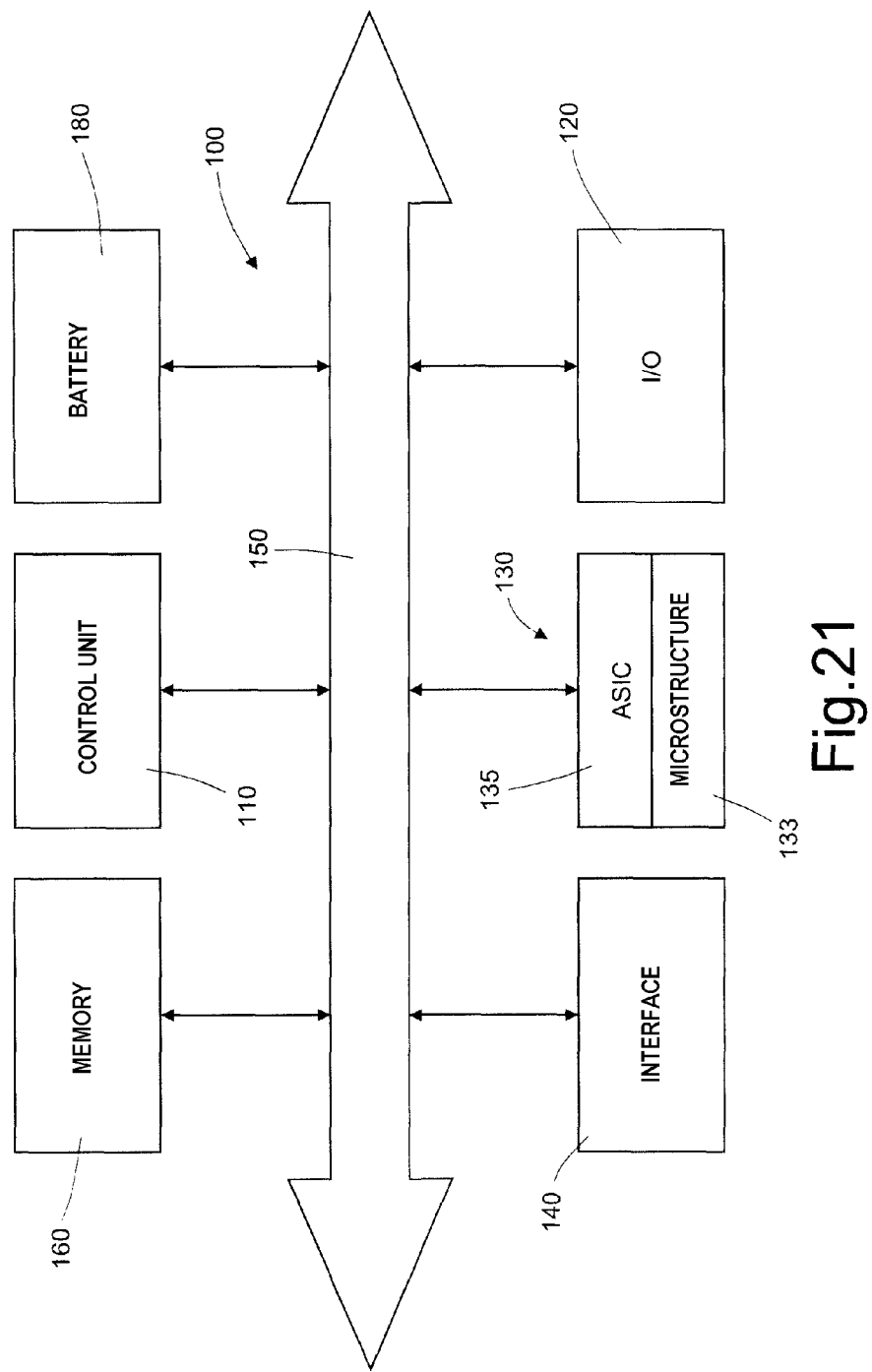

PROCESS FOR MANUFACTURING POWER INTEGRATED DEVICES HAVING SURFACE CORRUGATIONS, AND POWER INTEGRATED DEVICE HAVING SURFACE CORRUGATIONS

CROSS REFERENCE TO RELATED APPLICATIONS

This application claims the priority benefit of Italian patent application number TO2010A000521, filed on Jun. 17, 2010, entitled PROCESS FOR MANUFACTURING POWER INTEGRATED DEVICES HAVING SURFACE CORRUGATIONS, AND POWER INTEGRATED DEVICE HAVING SURFACE CORRUGATIONS, which is hereby incorporated by reference to the maximum extent allowable by law.

BACKGROUND OF THE INVENTION

1. Field of the Invention

The present invention relates to a process for manufacturing integrated power devices having surface corrugations and to an integrated power device having surface corrugations.

2. Discussion of the Related Art

As is known, integrated power devices should frequently meet severe requirements as regards both the maximum current and the reverse breakdown voltage. These requirements necessitate providing devices of considerable dimensions, which contrasts with the increasingly felt need to reduce the area occupied. The dimensions of power devices are particularly critical when also low-voltage devices are integrated in one and the same die. In these cases, in fact, more than 70% of the area available can be occupied by power devices.

For power devices there is hence posed the problem of obtaining a large area available for conduction, without sacrificing the overall dimensions.

It has been proposed to provide surface corrugations in the active areas so as to extend the conduction surface with respect to a plane surface with the same footprint.

In a lateral DMOS transistor, for example, the corrugations can be defined by projections and depressions that extend parallel to one another in a direction parallel to a line that joins the source regions and the drain regions. Projections and depressions are hence parallel also to the direction of flow of the current.

The corrugations are made as follows.

Before the body, source, and drain implantations are carried out, as well as that of the gate region, a semiconductor wafer in which the devices are to be formed is selectively etched with a mask to form parallel trenches, in a direction that joins a first region, intended to accommodate source regions, and a second region, intended to accommodate drain regions. Parallel projections are defined between adjacent trenches. A channel region, designed for conduction, extends in a band that traverses the projections and the trenches.

The surface of the wafer in the channel region is defined by a succession of parallel portions and of oblique portions. The profile of a section transversely to the projections and to the trenches is hence corrugated, and its development is greater than that of a plane surface without corrugations.

In known devices, however, the semiconductor surface in the electrically active region is deteriorated by the etches made to form the corrugations. Furthermore, the profile of the corrugations can be controlled only in a rather approximate way. Consequently, as a whole, the yield of the manufacturing processes is not satisfactory, and the effective levels of performance of the devices can easily depart from the nominal values.

SUMMARY OF THE INVENTION

An aim is to provide a process for manufacturing integrated power devices and an integrated power device that enables the limitations described to be overcome, in particular preserving the quality of the semiconductor material and offering an accurate control of the surface conformation.

According to an embodiment, there is provided a process for manufacturing a power integrated device comprising, in a semiconductor body, forming projections and depressions which extend in a first direction and are arranged alternated in succession in a second direction, transverse to the first direction, forming at least a first conduction region and a second conduction region, so as to define a current flow direction between the first conduction region and the second conduction region parallel to the first direction, along the projections and the depressions, wherein forming projections and depressions comprises selectively oxidizing first portions of the semiconductor body which extend in the first direction and correspond to respective depressions.

According to another embodiment, there is provided a power integrated device comprising, a semiconductor body, having projections and depressions, which extend in a first direction and are arranged alternated in succession in a second direction, transverse to the first direction, a first conduction region and a second conduction region, arranged so as to define a current flow direction between the first conduction region and the second conduction region parallel to the first direction, along the projections and the depressions; wherein ridges of the projections and a bottom of adjacent depressions are connected through walls having a rounded profile.

BRIEF DESCRIPTION OF THE DRAWINGS

For a better understanding, some embodiments will now be described, purely by way of non-limiting example and with reference to the attached drawings, wherein:

FIG. 1 is a top plan view of a semiconductor wafer in an initial step of a process for manufacturing integrated power devices according to one embodiment of the present invention;

FIG. 2 is a cross section through the wafer of FIG. 1, taken along the line II-II of FIG. 1;

FIGS. 3-5 show the wafer of FIG. 2 in subsequent steps of the manufacturing process;

FIG. 6 is a top plan view of the wafer of FIG. 5;

FIG. 12 is a top plan view of the wafer of FIG. 11, in a subsequent processing step;

FIG. 13 is a cross section through the wafer of FIG. 12, taken along the line XIII-XIII of FIG. 12, in a subsequent processing step;

FIG. 14 is a cross section through the wafer of FIG. 12, taken along the line XIV-XIV of FIG. 12, in the processing step of FIG. 13;

FIG. 15 shows the view of FIG. 13 in a subsequent processing step;

FIG. 16 shows the view of FIG. 14 in a subsequent processing step;

FIG. 17 is a perspective view three quarters from above of a portion of the wafer of FIGS. 15 and 16, in a subsequent processing step;

FIG. 18 shows the view of FIG. 15, which represents an integrated power device according to one embodiment;

FIG. 19 shows the view of FIG. 16, which represents an integrated power device according to a further embodiment;

FIG. 20 is a top plan view of a die obtained by dicing the wafer of FIGS. 18 and 19 and incorporating the device of FIG. 18 and the device of FIG. 19; and FIG. 21 is a simplified block diagram of an electronic system incorporating an integrated device according to one embodiment.

DETAILED DESCRIPTION

Figure 5:
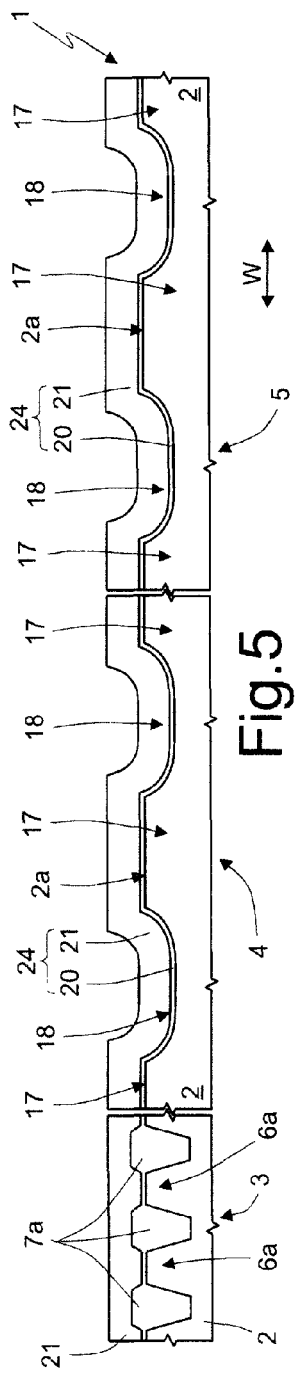
Figure 7:
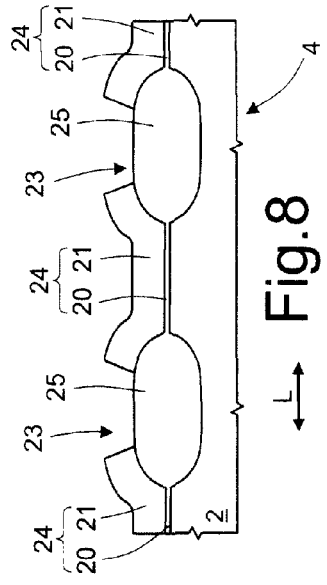
FIG. 7 is a cross section through the wafer of FIG. 6, taken along the line VII-VII of FIG. 6, in a subsequent processing step.
Figure 8:
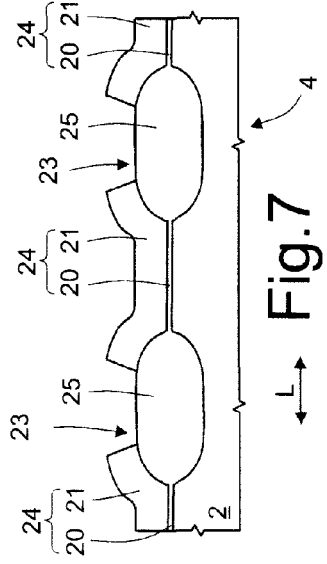
FIG. 8 is a cross section through the wafer of FIG. 6, taken along the line VIII-VIII of FIG. 6, in the processing step of FIG. 7.
Figure 9:
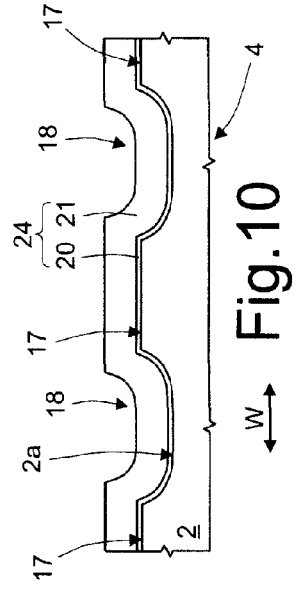
FIG. 9 is a cross section through the wafer of FIG. 6, taken along the line IX-IX of FIG. 6, in the processing step of FIG. 7.
Figure 10:
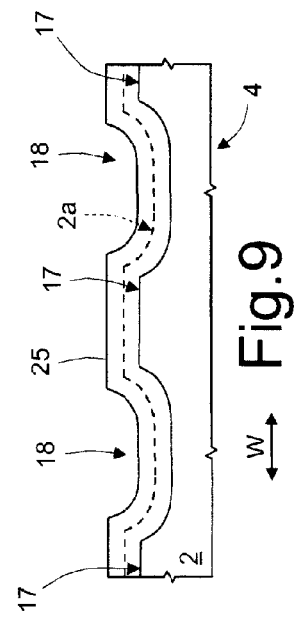
FIG. 10 is a cross section through the wafer of FIG. 6, taken along the line X-X of FIG. 6, in the processing step of FIG. 7.

With reference to FIGS. 1 and 2, a semiconductor wafer, designated by 1, comprises a substrate 2 of semiconductor material (for example, monocrystalline silicon of a P type), in which a low-voltage region 3, a first power region 4, and a second power region 5 are defined.

By known manufacturing steps, low-voltage insulating structures 7a, of a STI (Shallow-Trench-Insulation) type, which delimit low-power active areas 6a, are initially made in the low-voltage region 3. At the same time, in the second high-power active region 5 insulating power structures 7b are made, once again of an STI type, which delimit active power areas 6b.

A first pad-oxide layer 8 is then grown on the wafer 1 and a first silicon-nitride layer 9 is subsequently laid (FIG. 2).

A resist mask 10 is formed on the first silicon-nitride layer 9 and presents, on the first power region 4 and on the second power region 5, elongated windows 12, which extend mutually parallel in a direction perpendicular to the plane of FIG. 1, in a first direction L (see in particular FIG. 1). The windows 12 are adjacent to one another and are arranged in succession in a second direction W, perpendicular to the first direction L, so as to form a grid.

The low-voltage region 3 is internally protected by the resist mask 10.

The first silicon-nitride layer 9 and the first pad-oxide layer 8 are selectively etched through the resist mask 10 to form a shaping hard mask 14 having apertures 13 that correspond to respective windows 12. A surface 2a of the substrate 2 thus remains exposed through the windows 12 of the resist mask 10 and the apertures 13 in the first silicon-nitride layer 9 and in the first pad-oxide layer 8.

The resist mask 10 is then removed.

As illustrated in FIG. 3, through wet LOCOS (LOCal Oxidation of Silicon) thermal oxidation, LOCOS sacrificial structures 15 are obtained selectively in the exposed regions of the substrate 2. In greater detail, during the LOCOS oxidation step the LOCOS sacrificial structures 15 grow in part on top of and in part inside the substrate 2. Surface portions of the substrate 2 (designated by 2b in FIG. 1) are hence converted into silicon oxide. Furthermore, the LOCOS sacrificial structures 15 penetrate, with characteristic lateral beaks, in part underneath the first silicon-nitride layer 9 at the margins of the apertures 13. The LOCOS sacrificial structures 15 may have, for example, a thickness of between 300 nm and 400 nm.

During this step of the process, the surface 2a of the substrate 2 is modified because part of the silicon surface exposed through the apertures 13 is converted into oxide. In particular, the surface 2a has depressions 18, where the LOCOS sacrificial structures 15 are present, and projections 17, between adjacent depressions 18. The projections 17 and the depressions 18 extend in the first direction L and alternate with one another in the second direction W.

The shape of the depressions and the profile of the surface 2a in the second direction W are determined by the shape of the LOCOS sacrificial structures 15 and can be controlled precisely. In particular, the depth of the depressions 18 with respect to the projections 17 is determined by the degree of penetration of the LOCOS sacrificial regions 15 within the substrate 2.

In turn, the thickness of the LOCOS sacrificial structures 15 and the extension and inclination of the lateral beaks are determined by the initial thickness of the first pad-oxide layer 8, by the duration of the LOCOS step, and by the temperature.

Furthermore, thanks to the progressive penetration of the lateral beaks underneath the shaping hard mask 14, the ridges 17a of the projections 17, and the bottom 18a of the adjacent depressions 18 (which may be seen more clearly in FIG. 4) are connected through walls 19 having a rounded profile.

The LOCOS sacrificial structures 15, the first silicon-nitride layer 9 and the first pad-oxide layer 8 are then removed from the first power region 4 and the second power region 5. In particular, the LOCOS sacrificial structures 15 are etched with hydrofluoric acid so as to be removed completely. The structure shown in FIG. 4 is thus obtained, where the corrugations formed by the succession of projections 17 and depressions 18 are evident.

Then (FIGS. 5 and 6), a second pad-oxide layer 20 and a second silicon-nitride layer 21 are deposited in succession on the entire wafer 1. Through a resist mask (not shown), the second pad-oxide layer 20 and the second silicon-nitride layer 21 are then selectively etched to provide a second field hard mask 24 having apertures 23 on the first power region 4. In one embodiment (not shown), the etch with which the field hard mask 24 is defined proceeds so as to form recesses in the substrate 2. In this way, where necessary, it is possible to exploit the so-called "recessed LOCOS" technique and obtain LOCOS structures for field insulation, which extend prevalently within the substrate 2 and have a reduced projecting portion.

The apertures 23 are elongated in shape and extend parallel to one another in the second direction W. The apertures 23 thus extend transversely to the projections 17 and to the depressions 18 and expose underlying portions of the surface 2a of the substrate 2. In this step, the low-voltage region 3 and the second power region 5 remain protected.

As shown in FIGS. 7-10, a new LOCOS thermal oxidation is carried out to form, through the apertures 23 of the second field hard mask 24, LOCOS field-oxide structures 25 that run mutually parallel, transversely to the projections 17 and depressions 18. In this step, portions 2c of the substrate 2 (FIG. 6) exposed through the apertures 23 are converted into oxide, which moreover grows in part on top of the substrate 2.

Figure 11:
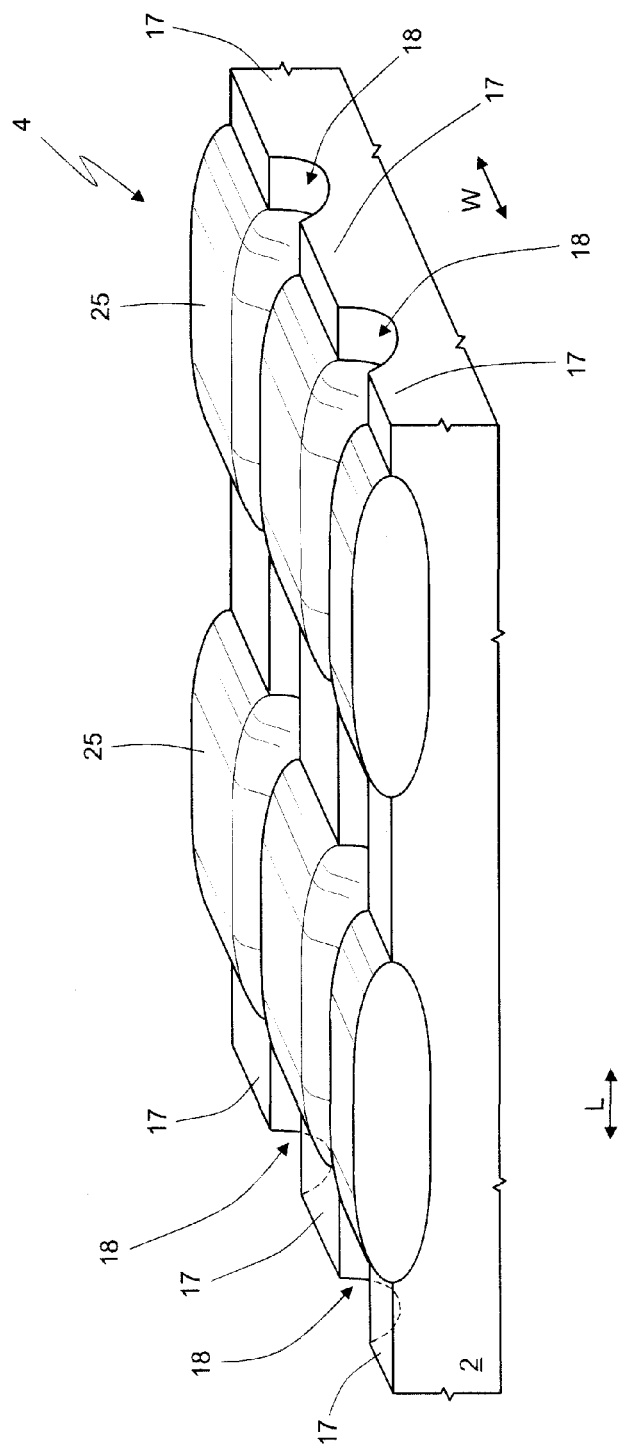
FIG. 11 is a perspective view three quarters from above of a portion of the wafer of FIGS. 7-10, in a subsequent processing step.

After thermal oxidation, the second silicon-nitride layer 21 and the second pad-oxide layer 20 are removed. The first power region 4, which is the only one to be modified in this step, assumes the appearance illustrated in FIG. 11.

As shown in FIGS. 12-14, after forming a sacrificial oxide layer 26, body, source, and drain implantations are carried out in the substrate 2 using masks (not shown). Thus, body wells 27 (of a P type), source regions 28 (of an N type), source-contact regions 29 (of an N+ type), and drain-contact regions 30 (of an N+ type) are made in the first power region 4 and in the second power region 5; and body wells 31 (of a P type), source regions 32 (of an N type), source-contact regions 33 (of an N+ type), and drain-contact regions 34 (of an N+ type) are made in the second power region 5.

In particular, in the first power region 4 the source region 28 is defined centrally between adjacent LOCOS field-oxide structures 25, at a distance there from, and extends in the second direction W, transversely to the projections 17 and depressions 18. The source-contact region 29 is nested in the source region 28. The drain-contact regions 30 are provided alongside the LOCOS field-oxide structures 25, on the side opposite to the source region 28.

In the second power region 5, the source region 32 extends in the second direction W, transversely to the projections 17 and depressions 18, and the drain-contact regions 34 are made alongside the source region 28. The source-contact region 33 is nested in the source region 32.

The implants are carried out where required also in the low-voltage region 3 to provide CMOS circuit components 24, which, however, are for simplicity illustrated only schematically, through circuit symbols.

The sacrificial oxide layer 26 is then removed, as shown in FIGS. 15 and 16, and in its place a thin gate-oxide layer 35 is grown, on which a polysilicon layer 36 is deposited.

By a photolithographic process, the polysilicon layer 36 and the gate-oxide layer 35 are defined to form, respectively, gate-oxide regions 37 and gate regions 38, in the first power region 4, and to form, respectively, gate-oxide regions 39 and gate regions 40, in the second power region 5. In use, the gate regions 38 and the gate regions 40 enable selective coupling and decoupling of the source region 28 and the drain regions 30 and, respectively, the source region 32 and the drain regions 34.

As shown also in FIG. 17, in the first power region 4 the gate-oxide regions 37 extend directly on the substrate 2 between the source region 28, which they slightly overlap, and respective LOCOS field-oxide structures 25. The gate regions 38 lie in part on respective gate-oxide regions 37 until they come to be arranged on top of the source region 28 and, in part, on respective LOCOS field-oxide structures 25. The portions of the gate regions 37 that extend on the LOCOS field-oxide structures 25 form so-called "field plates", which in use modify the biasing conditions in the substrate 2, increasing the reverse breakdown voltage of the junction between the source region 28 and the body region 27.

The process is completed by standard manufacturing steps, as shown in FIGS. 18 and 19. In particular, the following are provided: a dielectric layer 43; source contacts 45, gate contacts 46, and drain contacts 47 in the first power region 4; source contacts 50, gate contacts 51, and drain contacts 52 in the second power region 5; metallization lines (not illustrated); and a passivation layer 53. Furthermore, in the low-voltage region 3 (here not illustrated), the CMOS components 24 are completed.

In the first power region 4 there is thus defined a power device 55 (FIG. 18), which in the embodiment described is a lateral N-channel DMOS transistor arranged in part on the active area and in part on the field insulation (field plates on the LOCOS field-oxide structures 25). In the second power region 5, instead, a power device 57 is formed fully on the active area (FIG. 19, also in this case a lateral N-channel DMOS transistor).

Finally (FIG. 20), the wafer 1 is cut into dice 60, each of which comprises low-voltage CMOS devices 24, a power device 55 in the first power region 5, and a power device 57 in the second power region 5.

The process described advantageously enables provision of surface corrugations in conduction regions of integrated power devices and an increase in the section available for conduction, without, however, degrading the quality of the semiconductor material and hence the levels of performance.

In particular, the corrugations are defined by the succession of projections 17 and depressions 18 in the first power region 4 and in the second power region 5. Both in the power device 55 and in the power device 57, the current flows in use from the respective source region to the respective drain regions in the first direction L, parallel to the corrugations, when the source region and the drain regions are coupled as a result of the biasing of the respective gate regions. Given the same occupation of area, the cross section useful for conduction is greater than in the case of planar devices.

The use of the LOCOS technique to form the corrugations enables to preserve the quality of the semiconductor material at the surface of the substrate 1. Thermally oxidizing, in fact, converts the semiconductor material gradually and penetrates in depth in a uniform way. Furthermore, the LOCOS sacrificial structures are selectively removed, without damaging the semiconductor material, which remains substantially unaltered. Direct removal of semiconductor material is instead aggressive and produces irregularities and imperfections, so much so that an oxidation is frequently necessary subsequent to etching in order to restore the surface of the semiconductor material. In the process described, it is not necessary to carry out an oxidation after formation of the corrugations.

Furthermore, LOCOS oxidation enables precise determination of the shape and extension of the LOCOS sacrificial structures and hence also of the profile of the corrugations. In particular, the desired profile can be obtained by controlling the thickness of the initial pad-oxide layer and the temperature and duration of the thermally oxidizing.

Another advantage derives from the fact that the process of LOCOS thermal oxidation tends to produce structures without sharp edges, with gradual transitions between surfaces with different inclinations. The maximum values of electrical field and the related risks are hence reduced.

The process described enables making both fully-on-active power devices and devices with gate regions that extend on the field oxide (field plates).

The process is compatible with the preliminary provision of insulating structures of an STI type, but does not necessarily call for such structures. In particular, the process can be exploited for integrating power devices and low-voltage devices with any type of CMOS technology. CMOS devices obtained with process sub-0.35-µm technology as a rule require an insulation of an STI type for low-voltage devices. In this case, the process flow is substantially the one already described. Initially, the STI structures are formed in the low-voltage region and in the power regions, where necessary. Once the STI structures have been completed, the LOCOS technique is used to create the corrugations in the power regions and, if necessary, field-insulation structures.

The CMOS devices obtained with process technology equal to or higher than 0.35 µm use, also in the low-power region, insulating structures of a LOCOS type instead of an STI type. In this case, the process is simplified. The creation of LOCOS insulating structures does not in fact entail steps of planarization, which are instead necessary to provide STI insulating structures and should necessarily be carried out before forming the corrugations, for obvious reasons. In process technology equal to or larger than 0.35 μm, the low-voltage LOCOS insulating structures are formed together with the power LOCOS insulating structures, after formation of the corrugations, as described previously.

The process described is moreover compatible with the production of conventional (planar) power devices, which can be integrated in one and the same die by simply protecting the corresponding portions of the substrate 2 during formation of the corrugations.

A portion of a system 100 in accordance with one embodiment is illustrated in FIG. 21. The system 100 may comprise a controller 110, an input/output (I/O) device 120 (for example, a keyboard or a screen), a microelectromechanical device 130, a wireless interface 140, and a memory 160, of a volatile or non-volatile type, coupled together through a bus 150. In one embodiment, a battery 180 can be used for supplying the system 100. It is to be noted that the scope of the present invention is not necessarily limited to the embodiments having one or all of the devices listed.

The microelectromechanical device 130 comprises a microstructure 133 and an ASIC (application-specific integrated circuit) device 135, dedicated to driving and control of the microstructure 133 and, possibly, to detection of quantities that can be measured by means of the microstructure 133. The integrated device 135 comprises low-voltage CMOS components and power components integrated in one and the same semiconductor die and is provided according to what has been described with reference to FIGS. 1-19. In one embodiment, the microelectromechanical device 130 is a microelectromechanical sensor, such as, for example, an accelerometer, a gyroscope, a pressure sensor, a microphone. In a different embodiment, the microelectromechanical device 130 is a micro-actuator.

The controller 110 may comprise, for example, one or more microprocessors, microcontrollers, and the like.

The I/O device 120 can be used for generating a message. The system 100 can use the wireless interface 140 for transmitting and receiving messages to and from a wireless communications network with a radiofrequency (RF) signal. Examples of wireless interface may comprise an antenna, or a wireless transceiver, such as a dipole antenna, even though the scope of the present invention is not limited from this point of view. Furthermore, the I/O device 120 can provide a voltage representing what is stored either in the form of digital output (if digital information has been stored) or in the form of analog output (if analog information has been stored).

The system 100 can be used in apparatuses such as, for example, a palmtop computer (personal digital assistant, PDA), a laptop computer or portable computer, possibly with wireless capacity, a cell phone, a messaging device, a digital music player, a digital camera, or other devices.

Finally, it is evident that modifications and variations may be made to the process and to the device described herein, without thereby departing from the scope of the present invention, as defined in the annexed claims.

What is claimed is:

1. Process for manufacturing a power integrated device comprising:
   in a semiconductor body, forming projections and depressions which extend in a first direction and are arranged alternated in succession in a second direction, transverse to the first direction;
   forming at least a first conduction region and a second conduction region, so as to define a current flow direction between the first conduction region and the second conduction region parallel to the first direction, along the projections and the depressions; and
   forming at least a control region between the first conduction region and the second conduction region,
   wherein forming the projections and the depressions comprises selectively oxidizing first portions of the semiconductor body which extend in the first direction and correspond to respective depressions wherein the first conduction region, the second conduction region and the control region extend continuously along the second direction transversely to the projections and the depressions and wherein the control region, which extends continuously along the second direction transversely to the projections and the depressions in a completed power integrated device, controls current flow in the current flow direction along both the projections and the depressions.

2. Process according to claim 1, wherein selectively oxidizing first portions of the semiconductor body comprises forming sacrificial structures and forming projections and depressions comprises removing the sacrificial structures.

3. Process according to claim 1, comprising forming a shaping hard mask having a plurality of elongated apertures, which extend in the first direction and are arranged adjacent to one another in succession in the second direction, thereby forming a grid.

4. Process according to claim 3, wherein selectively oxidizing first portions of the semiconductor body comprises thermally oxidizing using the shaping hard mask.

5. Process according to claim 1, comprising forming at least a field insulation structure, arranged transversely to the projections and to the depressions, and extending in the second direction.

6. Process according to claim 5, wherein forming at least a field insulation structure comprises selectively oxidizing second portions of the semiconductor body, which extend in the second direction, transversely to the projections and to the depressions.

7. Process according to claim 6, comprising forming a field hard mask having plurality of elongated apertures, which extend in the second direction, transversely to the projections and to the depressions.

8. Process according to claim 7, wherein selectively oxidizing second portions of the semiconductor body comprises thermally oxidizing using the field hard mask.

9. Process according to claim 5, wherein the control region lies in part on the field insulation structure.

10. Process according to claim 5, wherein the first conduction region and the second conduction region are arranged at sides of the field insulation structure and extend in the second direction, transversely to the projections and to the depressions.

11. A method for making an integrated device, comprising:
   thermally oxidizing parallel, spaced-apart portions of a semiconductor substrate to define thermally oxidized regions which extend in a first direction;
   removing the thermally oxidized regions of the substrate to define parallel depressions and projections between the depressions;
   forming in the semiconductor substrate a first conduction region and a second conduction region which are spaced apart in the first direction; and
   forming a control region between the first conduction region and the second conduction region,
   wherein the first conduction region, the second conduction region and the control region extend continuously along a second direction transversely to the projections and the depressions and wherein the control region, which extends continuously along the second direction transversely to the projections and the depressions in a completed device, controls current flow in the first direction along both the projections and the depressions.

12. A method for making an integrated device as defined in claim 11, wherein thermally oxidizing portions of the semiconductor substrate comprises forming on the semiconductor substrate a mask having apertures that correspond to the parallel, spaced-apart portions of the substrate and thermally oxidizing the substrate through the apertures.

13. A method for making an integrated device as defined in claim 11, further comprising forming a field insulation structure extending in the second direction transversely to the projections and the depressions.

14. A method for making an integrated device as defined in claim 13, wherein forming the field insulation structure comprises oxidizing second portions of the semiconductor substrate which extend in the second direction.

15. A method for making an integrated device as defined in claim 14, wherein oxidizing second portions of the substrate comprises forming a mask having apertures which extend in the second direction, and oxidizing the semiconductor substrate through the apertures.

* * * * *